(12) United States Patent
Riepl et al.

(10) Patent No.: US 12,046,863 B2
(45) Date of Patent: Jul. 23, 2024

(54) APPARATUS AND METHOD FOR ESTABLISHING AN ELECTRICALLY CONDUCTIVE CONNECTION BETWEEN TWO SUBSTRATES

(71) Applicant: Vitesco Technologies GmbH, Hannover (DE)

(72) Inventors: Thomas Riepl, Munich (DE); Thomas Bäumler, Munich (DE); Christian Braun, Munich (DE)

(73) Assignee: Vitesco Technologies, GmbH, Regensburg (DE)

( * ) Notice: Subject to any disclaimer, the term of this patent is extended or adjusted under 35 U.S.C. 154(b) by 697 days.

(21) Appl. No.: 17/285,222

(22) PCT Filed: Oct. 8, 2019

(86) PCT No.: PCT/EP2019/077228
§ 371 (c)(1),
(2) Date: Apr. 14, 2021

(87) PCT Pub. No.: WO2020/078776
PCT Pub. Date: Apr. 23, 2020

(65) Prior Publication Data
US 2021/0384689 A1 Dec. 9, 2021

(30) Foreign Application Priority Data
Oct. 15, 2018 (DE) ..................... 10 2018 217 659.0

(51) Int. Cl.
*H01R 43/02* (2006.01)
*H01R 4/02* (2006.01)
(Continued)

(52) U.S. Cl.
CPC ......... *H01R 43/0263* (2013.01); *H01R 12/52* (2013.01); *H01R 12/7082* (2013.01);
(Continued)

(58) Field of Classification Search
CPC .... H01R 4/029; H01R 12/52; H01R 12/7082; H01R 12/732; H01R 13/03; H01R 43/0214; H01R 43/0221; H01R 43/0263
See application file for complete search history.

(56) References Cited

U.S. PATENT DOCUMENTS

| 3,772,776 A | 11/1973 | Weisenburger |
| 5,761,050 A | 6/1998 | Archer |

(Continued)

FOREIGN PATENT DOCUMENTS

| DE | 102007008109 A1 | 8/2008 |
| DE | 102009044933 A1 | 4/2011 |

(Continued)

OTHER PUBLICATIONS

International Search Report and Written Opinion for International Application No. PCT/EP2019/077228, mailed Jan. 31, 2020, with partial English translation, 8 pages.

(Continued)

*Primary Examiner* — Nathan Milakovich
(74) *Attorney, Agent, or Firm* — Buchanan Ingersoll & Rooney PC (57) ABSTRACT

A first and second substrate, and electrically conductive first and second connection parts are provided in a method for establishing an electrically conductive connection between two substrates. The first connection part is mounted on the first substrate by a first releasable connection and the second connection part is respectively mounted on the second substrate by a releasable connection. An electrically conductive connection assembly containing the first connection part and the second connection part is established by either a cohesive connection between a connection portion of the first connection part and a connection portion of the second connection part or an electrically conductive crossmember provided and a cohesive connection of a first length portion (Continued)

of the crossmember to the connection portion of the first connection part and a second cohesive connection of a second length portion of the crossmember to the connection portion of the second connection part being established.

19 Claims, 2 Drawing Sheets (51) Int. Cl.
    *H01R 12/52*     (2011.01)
    *H01R 12/70*     (2011.01)
    *H01R 12/73*     (2011.01)
    *H01R 13/03*     (2006.01)

(52) U.S. Cl.
    CPC ........... *H01R 12/73* (2013.01); *H01R 12/732* (2013.01); *H01R 4/029* (2013.01); *H01R 13/03* (2013.01); *H01R 43/0214* (2013.01); *H01R 43/0221* (2013.01)

(56) References Cited

U.S. PATENT DOCUMENTS

| | | | |
|---|---|---|---|
| 7,683,494 | B1 | 3/2010 | Stortini et al. |
| 8,217,277 | B2 | 7/2012 | Kraus et al. |
| 2008/0122075 | A1 | 5/2008 | Bauer et al. |
| 2008/0150102 | A1 | 6/2008 | Yokomae et al. |
| 2008/0298037 | A1* | 12/2008 | Kraus .................... H05K 1/148 361/803 |
| 2010/0112833 | A1* | 5/2010 | Jeon ....................... H05K 1/142 439/78 |
| 2011/0316130 | A1 | 12/2011 | Su et al. |
| 2013/0285221 | A1* | 10/2013 | Miyasaka ........... H01L 23/3735 219/121.64 |
| 2014/0206234 | A1* | 7/2014 | Mason ................. H05K 7/1053 439/607.35 |
| 2015/0064940 | A1 | 3/2015 | Mukunoki et al. |
| 2016/0181187 | A1 | 6/2016 | Kasahara et al. |
| 2017/0153015 | A1* | 6/2017 | Bukkems ............. H01R 13/641 |

FOREIGN PATENT DOCUMENTS

| | | |
|---|---|---|
| DE | 102012204489 A1 | 9/2013 |
| DE | 102014109220 A1 | 1/2016 |
| JP | 4108734 B1 | 6/2008 |
| JP | 2009021207 A * | 1/2009 |
| JP | 2009021207 A | 1/2009 |

OTHER PUBLICATIONS

International Search Report and Written Opinion for International Application No. PCT/EP2019/077228, mailed Jan. 31, 2020, 11 pages (German).

German Examination Report for German Application No. 10 2018 217 659.0, dated Sep. 9, 2019, 6 pages.

Office Action (The First Office Action) issued Dec. 29, 2023, by the National Intellectual Property Administration, P. R. China in corresponding Chinese Patent Application No. 201980068115.5 and an English translation of the Office Action. (26 pages).

* cited by examiner

APPARATUS AND METHOD FOR ESTABLISHING AN ELECTRICALLY CONDUCTIVE CONNECTION BETWEEN TWO SUBSTRATES

CROSS REFERENCE TO RELATED APPLICATIONS

This application is the U.S. National Phase Application of PCT International Application No. PCT/EP2019/077228, filed Oct. 8, 2019, which claims priority to German Patent Application No. 10 2018 217 659.0, filed Oct. 15, 2018, the contents of such applications being incorporated by reference herein.

FIELD OF THE INVENTION

The present disclosure relates to arrangements and methods for establishing an electrically conductive connection between two substrates, in particular between two circuit boards.

BACKGROUND OF THE INVENTION

Methods and arrangements of the kind mentioned at the outset are known in principle from the prior art. For example, it is known to connect two substrates by means of internal plug-in connections, but this is complex and a connection of this kind is only of limited robustness. The connection of two substrates by means of a screwed busbar is likewise common; this is also complex and provides only limited robustness of the connection. Finally, so-called press-fit connectors are known for connecting two substrates, but these only permit tolerance compensation limited to one direction (in particular vertically). It is also found to be disadvantageous that none of the connection techniques known for connecting substrates combine the properties of a) releasability and resulting repairability (during manufacture and in use), b) possible tolerance compensation, preferably in all three spatial directions, even with regard to the premounting of the substrates and the dimensions of the components, and c) desired robustness of the connection.

SUMMARY OF THE INVENTION

Against this background, an aspect of the present disclosure is that of advantageously developing methods of the kind mentioned at the outset. In particular, the aim is to be able to avoid at least some or, as far as possible, all of the abovementioned disadvantages.

A first aspect of the present disclosure is that of specifying a method for establishing an electrically conductive connection between two substrates. The connection is, in particular, a connection with a high-current capability.

According to one step of the method for establishing an electrically conductive connection, a first substrate and a second substrate are provided.

According to further method steps, an electrically conductive first connection part and an electrically conductive second connection part are provided. The connection parts each have a mounting portion and a connection portion.

According to further method steps, the first connection part is mounted on the first substrate by means of establishing a first releasable connection between its mounting portion and the first substrate and the second connection part is mounted on the second substrate by means of establishing a second releasable connection between its mounting portion and the second substrate.

According to a further method step, an electrically conductive connection assembly which contains the first connection part and the second connection part is produced. An electrically conductive connection between conductor track structures of the first substrate and conductor track structures of the second substrate is expediently established by means of the connection assembly for establishing the electrically conductive connection.

In one embodiment of the method, producing the connection assembly comprises a method step in which a cohesive connection is established between the connection portion of the first connection part and the connection portion of the second connection part.

In an alternative embodiment of the method, producing the connection assembly comprises a method step in which a crossmember is provided, a method step in which a cohesive connection is established between a first length portion of the crossmember and the connection portion of the first connection part and a method step in which a second cohesive connection is established between a second length portion of the crossmember and the connection portion of the second connection part. The crossmember preferably has an elongate shape and the first and the second length portion are offset in relation to one another in particular along a main direction of extent of the crossmember and can be spaced apart from one another along the main direction of extent.

In one embodiment of the method according to the first aspect, the cohesive connection(s) is/are established following the other method steps mentioned above.

A second aspect discloses a method for releasing an electrically conductive connection between two substrates. A method according to this aspect comprises executing a method for establishing an electrically conductive connection between two substrates according to the first aspect. Following the method step of establishing the cohesive connection or the method steps of establishing the cohesive connections, the first releasable connection is released and/or the second releasable connection is released, in particular for the purpose of repair work. In particular, the connection assembly is released from the first substrate and, respectively, from the second substrate by means of releasing the first and, respectively, the second releasable connection.

A third aspect discloses an arrangement which has a first substrate, a second substrate and an electrically conductive connection assembly. The arrangement is preferably produced using a method according to the first aspect.

The connection assembly has an electrically conductive first connection part which has a mounting portion and a connection portion. It further has an electrically conductive second connection part which has a mounting portion and a connection portion. The mounting portion of the first connection part is connected to the first substrate by means of a releasable connection and the mounting portion of the second connection part is connected to the second substrate by means of a releasable connection.

In one embodiment, the connection portion of the first connection part and a connection portion of the second connection part are connected by means of a cohesive connection. In an alternative embodiment, the connection assembly contains an electrically conductive crossmember, wherein a first length portion of the crossmember is connected to the connection portion of the first connection part by means of a cohesive connection and a second length portion of the crossmember is connected to the connection portion of the second connection part by means of a second cohesive connection.

The properties of a) releasability and resulting repairability (during manufacture and in use), b) possible tolerance compensation, preferably in all three spatial directions, even with regard to the premounting of the substrates and the dimensions of the components, and c) desired robustness of the connection can be achieved in combination as advantages. In particular, particularly good repairability advantageously results from the mentioned releasable connections on the two substrates. In this respect, the releasable connections can also be referred to as repairable connections.

A high degree of automation, in particular with a short cycle time, can advantageously be achieved in this way. Controlled positioning can be dispensed with. Process control via process parameters may advantageously be possible (in contrast to this, a large number of geometric tolerances are involved, for example in the case of screw connections). As will be explained below, an aspect of the invention advantageously also renders possible particle-free final mounting. The method and the arrangement are suitable for all connectors of circuit boards and are particularly attractive in the case of high current intensities and stringent safety requirements, wherein—for example owing to a preferably particle-free design—good insulation can be rendered possible.

It goes without saying that the two connection portions are electrically conductively connected, in particular by way of the two connection portions being fixed to one another with direct contact. Since at least two or more substrates can be or are connected to one another in the described electrically conductive manner, in particular with a high-current capability, the methods and, respectively, the arrangement also render possible high-current applications, in particular with a modular design.

A connection with high-current capability is understood to mean a connection which is suitable for transmitting currents in the order of magnitude of 10 amperes to 1000 amperes and, in particular, is adapted thereto. In the context of an aspect of the invention, a releasable connection is in each case understood to mean a connection which can be released in such a way that at least one connection partner can be reused after the connection is released. The substrates are preferably circuit boards which, for their part, contain electrically insulating material and electrically conductive connections (conductor tracks) adhering thereto.

Features of the embodiments and developments of the method according to the first aspect, the method according to the second aspect and the arrangement according to the third aspect will be explained below. These features can each also be used for embodiments and developments of methods and arrangements according to the other aspects, even if they are not explicitly discussed in connection with the method or the arrangement of the respective aspect.

In an expedient embodiment, the first and/or the second connection part are one-piece metal parts—that is to say, in particular, metal parts produced from a single workpiece and not made up of several individual elements—for example metal blocks or sheet-metal pieces.

In one embodiment of the method according to the first aspect, an electrically conductive first punched strip is provided as the first connection part and an electrically conductive second punched strip is provided as the second connection part. The punched strips are, for example, metal strips, in particular a sheet-metal strips, which can expediently be produced by punching.

In one development of this embodiment, the first substrate and the second substrate are mounted in a position fixed relative to one another in such a way that the connection portion of the first punched strip and the connection portion of the second punched strip overlap in an overlap region, and the cohesive connection of the connection portion of the first punched strip to the connection portion of the second punched strip is established within the overlap region, in particular by means of a welded connection.

In one embodiment of the arrangement, the first connection part is an electrically conductive first punched strip and the second connection part is an electrically conductive second punched strip. The first substrate and the second substrate are mounted in a position fixed relative to one another in such a way that the connection portion of the first punched strip and the connection portion of the second punched strip overlap in an overlap region. The connection portion of the first punched strip and the connection portion of the second punched strip are connected within the overlap region by means of a cohesive connection.

In one development, the connection portion of the first punched strip extends parallel or substantially parallel to a direction of extent of the first substrate after the first releasable connection is established, in particular as early as before the cohesive connection is established. As an alternative or in addition, the connection portion of the second punched strip can extend parallel or substantially parallel to a direction of extent of the second substrate after the second releasable connection is established, in particular as early as before the cohesive connection is established. In this case, it is provided, in particular, that the first punched strip has a length portion which adjoins its mounting portion and this length portion and the connection portion of the first punched strip run at a right angle or substantially at a right angle to one another. In addition or as an alternative, it can be provided that the second punched strip has a length portion which adjoins its mounting portion and this length portion and the connection portion of the second punched strip run at a right angle or substantially at a right angle to one another. In particular, the length portion and the connection portion of the respective punched strip form an L-shape in this way. Within the meaning of the present disclosure, a substantially parallel extent or a substantially right-angled profile is understood to mean up to an angular difference of 10° as given.

In some embodiments, there can be a gap between the connection portion of the first punched strip and the connection portion of the second punched strip after the step of mounting the first substrate and the second substrate in a position fixed relative to one another. In particular, the connection portion of the first punched strip and the connection portion of the second punched strip can be spaced apart transversely—in particular perpendicularly—to a longitudinal direction of the connection portion of the first punched strip and/or transversely—in particular perpendicularly—to a longitudinal direction of the connection portion of the second punched strip. In this case, the longitudinal direction is, in particular, the main direction of extent of the respective portion, in particular the direction parallel to its longest edge.

In developments of such embodiments, this gap is reduced or eliminated, before the connection portion of the first punched strip is connected to the connection portion of the second punched strip by means of the cohesive connection. The cross section of the punched strips is preferably selected such that they have a certain degree of flexibility, wherein the punched strips can preferably bend with a relatively low force in order to eliminate the gap, without significantly or even disadvantageously subjecting their connection point to one of the substrates to loading in the process. This also renders it possible, before the cohesive connection, to readily compensate for vertical tolerances, which can be, for example, 0.4 mm or else can differ therefrom, between the two connection portions in a simple manner, for example by bending one or both of the punched strips with a pair of pliers, in order to reduce or to eliminate the gap. In this context, for example, said gap is reduced or eliminated by way of the first punched strip and/or the second punched strip being deformed, in particular by means of a pair of pliers, wherein the bending is performed in an elastic, in particular purely elastic, manner.

In one embodiment, the first and the second punched strip are dimensioned and arranged, in particular before the cohesive connection is established, in such a way that the connection portion of the first punched strip and the connection portion of the second punched strip form a flat contact zone with one another in their overlap region, wherein the areal extent of the contact zone is larger than the areal extent of the welded connection. In this way, lateral tolerances between the substrates, which can lie in an order of magnitude of 1 millimeter for example, can advantageously be compensated for.

In one embodiment, the connection assembly consists of the two punched strips.

In another embodiment,—instead of the punched strips—an electrically conductive first platform is provided as the first connection part and an electrically conductive second platform is provided as the second connection part. The electrically conductive platforms are, for example, metal blocks, for example metal cuboids. The mounting portion is, for example, a surface of the first and, respectively, second platform which faces the first and, respectively, second substrate. The connection portion is, for example, a surface of the respective platform which is opposite the mounting portion—in other words: which faces away from the respective substrate.

In addition, in this embodiment, an electrically conductive crossmember is preferably provided, the first length portion of said crossmember adjoining its first longitudinal end and the second length portion of said crossmember adjoining its second longitudinal end. In one development, the first substrate and the second substrate are mounted in a position fixed relative to one another in such a way that the first length portion of the crossmember overlaps with the connection portion of the first platform in a first overlap region and that the second length portion of the crossmember overlaps with the connection portion of the second platform in a second overlap region. The cohesive connection between the first length portion and the first connection portion is preferably established within the first overlap region and the second cohesive connection between the second length portion and the second connection portion is preferably established within the second overlap portion.

In one embodiment of the arrangement, the first connection part is an electrically conductive first platform and the second connection part is an electrically conductive second platform. The connection assembly has an electrically conductive crossmember as the crossmember, the first length portion adjoining the first longitudinal end of said crossmember and the second length portion adjoining the second longitudinal end of said crossmember. The first substrate and the second substrate are mounted in a position fixed relative to one another in such a way that the first length portion overlaps the connection portion of the first platform in a first overlap region and is connected to the connection portion of the first platform by means of a cohesive connection within the first overlap region, and that the second length portion overlaps the connection portion of the second platform in a second overlap region and is connected to the connection portion of the second platform by means of a second cohesive connection within the second overlap region.

According to one development, the connection assembly consists of the two platforms and the crossmember.

According to one embodiment, the crossmember is a flexible tape, in particular a flexible metal tape. Tolerances can be particularly easily compensated for in this way.

With regard to a preferred refinement as a connection with high-current capability, it is possible that the first connection part contains copper or consists of pure copper and/or that the second connection part contains copper or consists of pure copper and/or that the crossmember contains copper or consists of pure copper. Pure copper is preferred owing to the high electrical conductivity, so that it is particularly suitable for connections with high-current capability. However, it goes without saying that any other metal or any other alloy can be used instead of copper, provided that it is suitable for the described method steps.

It is considered to be expedient that the first releasable connection is a soldered connection—in particular by means of through-hole technology (THT) or by means of surface mounting (SMD)—or is a press fit and/or that the second releasable connection is a soldered connection—in particular by means of through-hole technology (THT) or by means of surface mounting (SMD)—or is a press fit. Any other connection technique which is releasable in the explained sense can be used instead of a soldered connection or press fit.

For example, in one development, as an alloy, CuSn0.15 is used as material for the first connection part and/or for the second connection part and/or for the crossmember in the case of a press fit. This alloy can also be resistance-welded depending on conditions and therefore also opens up new options for establishing the cohesive connection(s).

According to one embodiment, the cohesive connection, the cohesive connections or at least one of the cohesive connections is/are each a welded connection.

For example, if copper is used as the material, the welded connection or the welded connections can be established by means of a laser-welding method, in particular by means of a green laser, or by means of a resistance-welding method. Welding by means of a green laser is associated with the advantage that it is suitable for welding copper and that a particle-free welded connection, that is to say a welded connection that is free of welding spatter, can be produced. The risk of short circuits on the circuit, particularly in the case of high-current circuits, that exist in the case of conventional welded connections due to the welding spatter can be avoided in this way. Welding allows a robust connection to be established in a desirable manner. It is particularly advantageous that tolerance compensation in the lateral and the vertical direction is possible in the process, as described. However, instead of welding, any other, preferably particle-free, connection technique combined with the overlap technique that serves for tolerance compensation can also be used.

According to one embodiment, the first substrate and/or the second substrate are/is a circuit board, in particular a printed circuit board (PCB) or a ceramic circuit board (DCB). The arrangement according to the third aspect is then, in particular, a circuit board arrangement. In one development, the method according to the first aspect is a method for producing a circuit board assembly comprising the first substrate, which is a first circuit board in particular, the second substrate, which is a second circuit board in particular, and the electrically conductive connection assembly, wherein the electrically conductive connection between the first substrate and the second substrate is established by means of the connection assembly.

According to a further embodiment, the step of mounting the first substrate and the second substrate in a position fixed relative to one another involves the first substrate and the second substrate being attached to a carrier which is jointly associated with them, in particular to a technical device, to a housing or to a heat sink, such as a metal plate for example. In the arrangement, the first and the second substrate are, in particular, mounted on the carrier.

In one development, the substrates are mounted on the carrier such that the first substrate and the second substrate are mounted next to one another, in particular in a common plane, and/or one above the other. In order to produce any desired geometries, it is possible in the case of the described methods to bend the punched strips or the crossmember in any desired manner, for example at a flat overlap or contact region. The bending can be performed after the cohesive connection(s) is/are established.

In one embodiment, each of the two mounting portions—in particular of the respective punched strip or platform—is electrically conductively connected to a conductor track of the substrate which is associated with it for connection purposes, wherein the respective electrically conductive connection is made, in particular, by means of establishing the respective releasable connection to the substrate.

BRIEF DESCRIPTION OF THE DRAWINGS

An aspect of the invention will be described in more detail below with reference to the appended figures which show preferred exemplary embodiments of the invention. In the figures.

DESCRIPTION OF THE EXEMPLARY EMBODIMENTS

Figure 1:
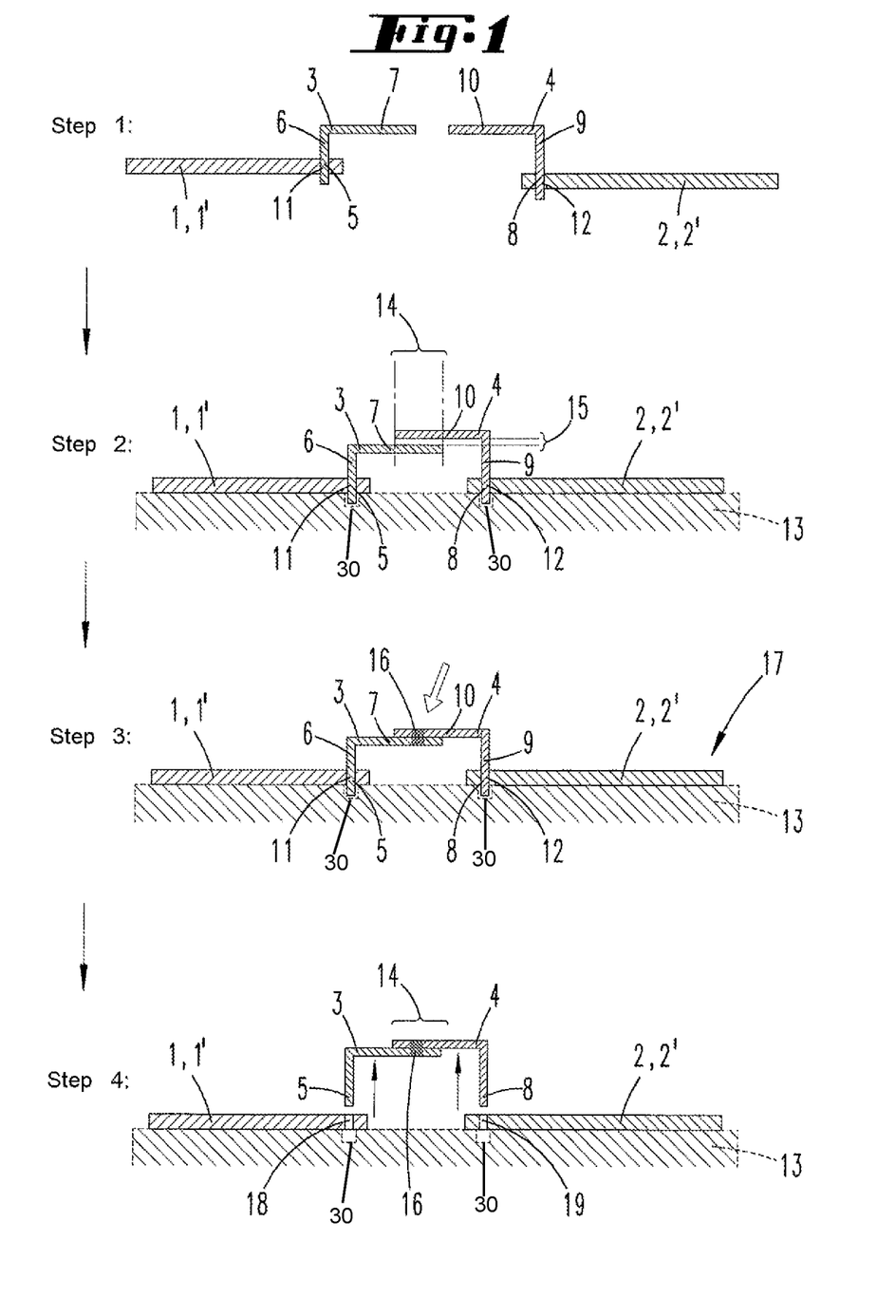
FIG. 1 schematically shows, in respective sectional views, steps 1-3 when implementing a preferred exemplary embodiment of a method according to the invention for establishing an electrically conductive connection between two substrates and, in step 4, a preferred step for releasing the electrically conductive connection between the two substrates.

FIG. 1 shows, in steps 1, 2 and 3, method steps when executing a preferred exemplary embodiment of a first method according to the invention for establishing an electrically conductive connection between two substrates 1 and 2. In the example, the two substrates 1, 2 are each a printed circuit board (PCB) which comprises, in a manner not illustrated in any detail, one or more layers composed of electrically conductive material and electrically conductive conductor tracks adhering thereto. In the example, the method serves for establishing a connection with a high-current capability. In step 1, it is shown that a first punched strip 3 and a second punched strip 4, which are each flexible strips composed of pure copper, are provided for the connection. The first punched strip 3 comprises a mounting portion 5, a length portion 6 adjoining it and a connection portion 7, and the second punched strip 4 comprises a mounting portion 8, a length portion 9 adjoining it in a rectilinear manner and a connection portion 10. As a result of step 1, the first punched strip 3 was mounted on the first substrate 1 by means of an electrically conductive first releasable connection 11. In a corresponding manner, the second punched strip 4 was mounted on the second substrate 2 by means of establishing an electrically conductive second releasable connection 12 between the mounting portion 8 of the second punched strip 4 and the second substrate 2. In the example, the two releasable connections 11, 12 are each a soldered connection, not illustrated in any detail in the figures, established by means of through-hole technology (THT). After step 1, the two substrates 1, 2 with the punched strips 3, 4 mounted on them are still freely movable relative to one another.

The two substrates 1, 2 are mounted on a carrier 13 common to them in this respect, so that the two substrates 1, 2 are in a fixed position or have a fixed gap relative to one another, only in step 2. The relative positions may be fixed, for example, by inserting ends of mounting portions 5/8 into respective receivers 30 in carrier 13. This mounting can be performed using customary techniques familiar to a person skilled in the art. The mounting is performed in such a way that the connection portion 7 and the connection portion 10 overlap in an overlap region 14, wherein there is initially a gap 15 between the two connection portions 7, 10 in a direction perpendicular to the substrates 1, 2.

In step 3, the gap 15 extending transversely to the connection portions 7, 10 was eliminated by way of the punched strips 3, 4 being slightly bent by means of a pair of pliers and the connection portions 7, 10 being connected by means of a welded connection 16 within the overlap region 14. In the example, the mounting portion 6 was electrically conductively connected, by means of the releasable connection 11 in a manner not shown in any detail in the figures, to an electrically conductive conductor track (likewise not shown) of the printed circuit board corresponding to the substrate 1. In a corresponding manner, the second punched strip was electrically conductively connected, at its mounting portion 8 by means of the second releasable connection 12, to an electrical conductor track of the printed circuit corresponding to the second substrate 2 in the example. The two conductor tracks of the substrates 1, 2 or the circuit boards corresponding to these substrates 1, 2 in the example were connected to one another with high-current capability in this way.

As shown in FIG. 1 relating to step 1, the connection portion 7 of the first punched strip 3 extends parallel to a plane spanned by the first substrate 1 (perpendicular to the plane of FIG. 1) after the first releasable connection 11 is established and before the welded connection 16 is established, wherein the connection portion 7 extends at a right angle to the length portion 6 adjoining the mounting portion 5 in a rectilinear manner. The same applies to the second punched strip 4. It is also clear from the illustration relating to step 3 in FIG. 1 that an areal extent of the welded connection 16 is smaller than an areal extent of the contact zone situated in the overlap region 14. Furthermore, in the illustrations, reference sign 1' denotes the circuit board corresponding to the substrate 1 and reference sign 2' denotes the circuit board corresponding to the substrate 2. In the exemplary embodiment shown in FIG. 1, the two substrates 1, 2 were mounted next to one another in a common plane on the carrier 13. In this case, the illustration relating to step 3 shows, at the same time, a preferred exemplary embodiment of an arrangement 17 according to the invention as a result of the described method.

The illustration contained in FIG. 1 relating to step 4 relates to a method according to an aspect of the invention for releasing an electrically conductive connection between two substrates 1, 2. In the exemplary embodiment, this method first requires the above-described method to be executed. Then, it is provided that the two releasable connections 11, 12 are released again in order to be able to remove the mounting portions 5, 8 from the holes 18, 19, associated with them, in the substrates 1, 2 in the indicated arrow direction. In this way, the two punched portions 3, 4 which are connected by means of the welded connection 16 can be removed, for example for the purpose of repair work, and can be replaced, for example, by new punched strips and a new welded connection.

Figure 2:
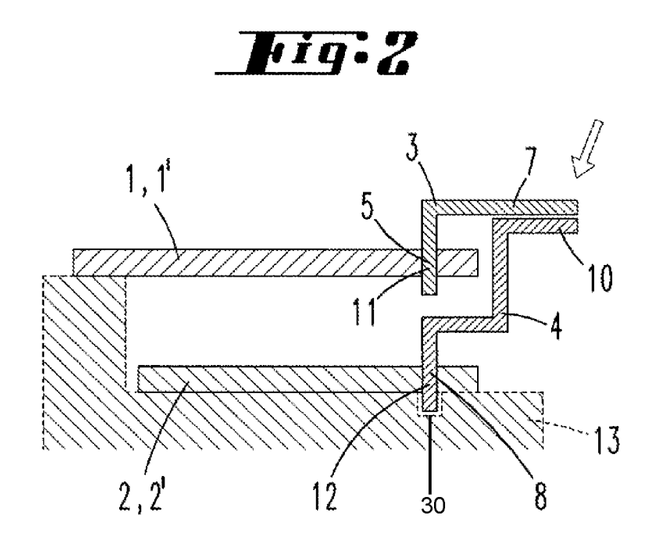
FIG. 2 likewise schematically shows a sectional view of a method step when executing a second preferred exemplary embodiment of a method according to the invention for establishing an electrically conductive connection between two substrates.

FIG. 2 schematically shows a method step when executing a further preferred exemplary embodiment of the method according to the invention. For reasons of improved clarity, FIG. 2 (and also FIG. 3) contains the reference signs corresponding to FIG. 1 for corresponding or comparable details. In this case, the situation shown in FIG. 2 is comparable to step 2 of FIG. 1, apart from the geometric deviation. One difference is that, in FIG. 2, the two substrates 1, 2 were not mounted next to one another, but rather one above the other, on the carrier 13. The position of substrate 2/2' may be fixed, for example, by inserting the end of mounting portion 8 into receiver 30 in carrier 13. The second punched strip 4 was angled several times, so that the connection portions 7, 10 again run parallel to one another and form a flat contact zone within which a welded connection 16 (not shown in FIG. 2) can be established.

Figure 3:
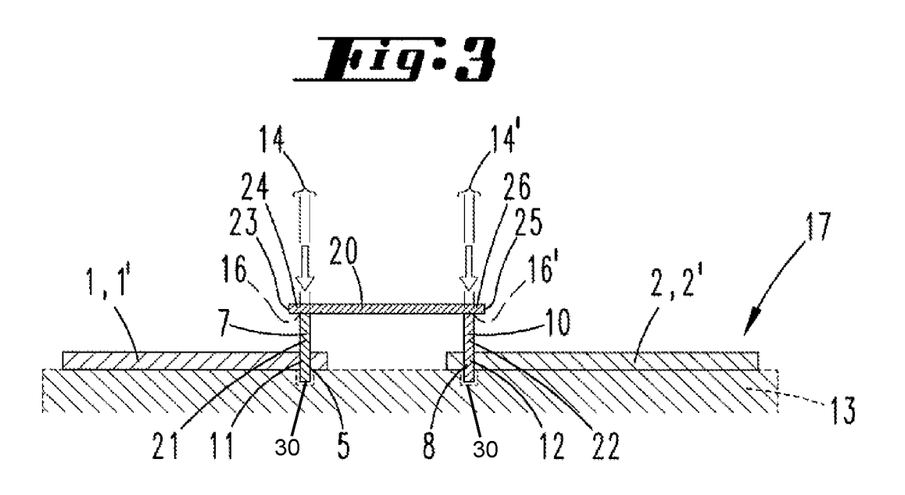
FIG. 3 schematically shows a sectional view of a method step when executing, in a preferred manner, a second method according to an aspect of the invention for establishing an electrically conductive connection between two substrates.

FIG. 3 schematically shows a method step in a preferred exemplary embodiment of a further method according to the invention for producing an electrically conductive connection between two substrates 1, 2. The connection in the example is a connection with a high-current capability too. In the example, a first platform 21, a second platform 22 and a crossmember 20, which each consist of copper for achieving electrical conductivity, serve for connection purposes. The first platform 11 comprises a mounting portion 5 and a connection portion 10. The mounting portion 5 is electrically conductively connected to an electrical conductor track (not shown in FIG. 3) of the first circuit board 1 by means of an electrically conductive first releasable connection 11. The second platform 22 is electrically conductively connected to a conductor track of the second circuit board 2' at its mounting portion 8 in a corresponding manner by means of an electrically conductive second releasable connection 12. The first substrate 1 and the second substrate 2 are mounted on a common carrier 13 in a non-variable position in relation to one another. The relative positions of substrates 1 and 2 may be fixed, for example, by inserting ends of mounting portions 5/8 into respective receivers 30 in carrier 13. The crossmember 20, which has a first longitudinal end 23 and a length portion 24 adjoining it as well as a second longitudinal end 25 and a length portion 26 adjoining it, was then supported on the two platforms 21, 22 and in the process positioned such that its first length portion 24 overlaps the connection portion 7 of the first platform 21 in a first overlap region 14 and so that its second length portion 26 overlaps the connection portion 10 of the second platform 22 in a second overlap region 14. As indicated by the two arrows, the first length portion 24 was then connected to the first connection portion 7 by means of a first welded connection 16 within the first overlap region 14. In a corresponding manner, the second length portion 26 was connected to the second connection portion 10 by means of a welded connection 16' within the second overlap portion 14'. The welded connections 16, 16' produced by means of a green laser are not shown in any detail in the example.

FIG. 3 is, at the same time, a preferred exemplary embodiment of an arrangement 27 according to the invention, including two platforms 21, 22 and a crossmember 20.

All of the disclosed features are essential to aspects of the invention (individually but also in combination with one another). The dependent claims, by way of their features, characterize independent inventive developments of the prior art, in particular for the purpose of filing divisional applications on the basis of said claims.

The invention claimed is:

1. A method for establishing an electrically conductive connection between two substrates, comprising:
    providing a first substrate and a second substrate,
    providing an electrically conductive first connection part having a proximal end portion and a distal end portion,
    mounting the first connection part on the first substrate by establishing a first releasable connection between a mounting portion of the first connection part at the proximal end portion of the first connection part and the first substrate via a through hole in the first substrate,
    providing an electrically conductive second connection part having a proximal end portion and a distal end portion,
    mounting the second connection part on the second substrate by establishing a second releasable connection between a mounting portion of the second connection part at the proximal end portion of the second connection part and the second substrate via a through hole in the second substrate,
    and
    producing an electrically conductive connection assembly which contains the first connection part and the second connection part,
    wherein producing the connection assembly comprises:
    either establishing a cohesive connection between a connection portion of the first connection part at the distal end portion of the first connection part and a connection portion of the second connection part at the distal end portion of the second connection part,
    or providing an electrically conductive crossmember, establishing a cohesive connection of a first length portion of the crossmember with the connection portion of the first connection part at the distal end portion of the first connection part and establishing a second cohesive connection of a second length portion of the crossmember with the connection portion of the second connection part at the distal end portion of the second connection part.

2. The method as claimed in claim 1, wherein a welded connection is established as at least one of the cohesive connection and the second cohesive connection.

3. The method as claimed in claim 2, wherein
    an electrically conductive first punched strip is provided as the first connection part and an electrically conductive second punched strip is provided as the second connection part, the first substrate and the second substrate are mounted in a position fixed relative to one another in such a way that the connection portion of the first punched strip and the connection portion of the second punched strip overlap in an overlap region, and the cohesive connection between the connection portion of the first connection part and the connection portion of the second connection part is established within the overlap region.

4. The method as claimed in claim 2, wherein an electrically conductive first platform is provided as the first connection part and an electrically conductive second platform is provided as the second connection part, a crossmember is provided as the electrically conductive crossmember, the first length portion of said crossmember adjoining its first longitudinal end and the second length portion of said crossmember adjoining its second longitudinal end, the first substrate and the second substrate are mounted in a position fixed relative to one another in such a way that the first length portion of the crossmember overlaps the connection portion of the first platform in a first overlap region and that the second length portion of the crossmember overlaps the connection portion of the second platform in a second overlap region, and the cohesive connection between the first length portion and the first connection portion is established within the first overlap region and the second cohesive connection between the second length portion and the second connection portion is established within the second overlap portion.

5. The method as claimed in claim 1, wherein an electrically conductive first punched strip is provided as the first connection part and an electrically conductive second punched strip is provided as the second connection part, the first substrate and the second substrate are mounted in a position fixed relative to one another in such a way that the connection portion of the first punched strip and the connection portion of the second punched strip overlap in an overlap region, and the cohesive connection between the connection portion of the first connection part and the connection portion of the second connection part is established within the overlap region.

6. The method as claimed in claim 5, wherein the connection portion of the first punched strip extends substantially parallel to a main plane of extent of the first substrate after the first releasable connection is established and before the cohesive connection is established and/or the connection portion of the second punched strip extends substantially parallel to a main plane of extent of the second substrate after the second releasable connection is established and before the cohesive connection is established, and a length portion of the first punched strip, which length portion adjoins the mounting portion, runs substantially at a right angle to the connection portion of said first punched strip and/or a length portion of the second punched strip, which length portion adjoins the mounting portion, runs substantially at a right angle to the connection portion of said second punched strip.

7. The method as claimed in claim 6, wherein there is a gap between the connection portion of the first punched strip and the connection portion of the second punched strip transversely to a longitudinal direction of the connection portion of the first punched strip and/or transversely to a longitudinal direction of the connection portion of the second punched strip after the step of mounting the first substrate and the second substrate in a position fixed relative to one another, this gap being reduced or eliminated by elastically bending the first punched strip and/or the second punched strip, before the connection portion of the first punched strip is connected to the connection portion of the second punched strip by the cohesive connection.

8. The method as claimed in claim 5, wherein there is a gap between the connection portion of the first punched strip and the connection portion of the second punched strip transversely to a longitudinal direction of the connection portion of the first punched strip and/or transversely to a longitudinal direction of the connection portion of the second punched strip after the step of mounting the first substrate and the second substrate in a position fixed relative to one another, this gap being reduced or eliminated by elastically bending the first punched strip and/or the second punched strip, before the connection portion of the first punched strip is connected to the connection portion of the second punched strip by the cohesive connection.

9. The method as claimed in claim 5, wherein the step of mounting the first substrate and the second substrate in a position fixed relative to one another involves the first substrate and the second substrate being attached to a carrier which is jointly associated with them to either a technical device, a housing, or a heat sink, wherein at least one of the proximal end portion of the first connection part and the proximal end portion of the second connection part are partially disposed in a respective receiving part in the carrier.

10. The method as claimed in claim 1, wherein an electrically conductive first platform is provided as the first connection part and an electrically conductive second platform is provided as the second connection part, a crossmember is provided as the electrically conductive crossmember, the first length portion of said crossmember adjoining its first longitudinal end and the second length portion of said crossmember adjoining its second longitudinal end, the first substrate and the second substrate are mounted in a position fixed relative to one another in such a way that the first length portion of the crossmember overlaps the distal portion of the connection portion of the first platform in a first overlap region and that the second length portion of the crossmember overlaps the distal portion of the connection portion of the second platform in a second overlap region, and the cohesive connection between the first length portion and the first connection portion is established within the first overlap region and the second cohesive connection between the second length portion and the second connection portion is established within the second overlap portion.

11. A method for releasing an electrically conductive connection between two substrates, wherein a method for establishing an electrically conductive connection between two substrates is executed as claimed in claim 1 and, following the method step of establishing the cohesive connection or connections the connection assembly is released from the first substrate and, respectively, from the second substrate by releasing the first releasable connection and/or by releasing the second releasable connection.

12. An arrangement, comprising:
a first substrate,
a second substrate, and
an electrically conductive connection assembly, wherein
the connection assembly contains an electrically conductive first connection part, which has a mounting portion at a proximal portion thereof and a connection portion at a distal portion thereof, and an electrically conductive second connection part, which has a mounting portion at a proximal portion thereof and a connection portion at a distal portion thereof,
the mounting portion of the first connection part is connected at its proximal portion to the first substrate by a releasable connection via a through hole in the first substrate and the mounting portion of the second connection part is connected at its proximal portion to the second substrate by a releasable connection via a through hole in the second substrate, and
either the connection portion of the first connection part at its distal portion and the connection portion of the second connection part at its distal portion are connected by a cohesive connection,
or the connection assembly has an electrically conductive crossmember and a first length portion of the crossmember is connected to the connection portion of the first connection part at its distal portion by a cohesive connection and a second length portion of the crossmember is connected to the connection portion of the second connection part at its distal portion by a second cohesive connection.

13. The arrangement as claimed in claim 12, wherein the crossmember is a flexible tape.

14. The arrangement as claimed in claim 13, wherein the first connection part contains copper or consists of pure copper and/or the second connection part contains copper or consists of pure copper and/or the crossmember contains copper or consists of pure copper.

15. The arrangement as claimed in claim 12, wherein the first connection part contains copper or consists of pure copper and/or the second connection part contains copper or consists of pure copper and/or the crossmember contains copper or consists of pure copper.

16. The arrangement as claimed in claim 12, wherein the first releasable connection is a soldered connection and/or the second releasable connection is a soldered connection.

17. The arrangement as claimed in claim 12, wherein the first substrate and/or the second substrate are either a printed circuit board or a ceramic circuit board.

18. The arrangement as claimed in claim 12, wherein
the first connection part is an electrically conductive first punched strip and the second connection part is an electrically conductive second punched strip,
the first substrate and the second substrate are mounted in a position fixed relative to one another in such a way that the connection portion of the first punched strip and the connection portion of the second punched strip overlap in an overlap region, and
the connection portion of the first punched strip and the connection portion of the second punched strip are connected within the overlap region by a welded connection as the cohesive connection.

19. The arrangement as claimed in claim 12, wherein
the first connection part is an electrically conductive first platform and the second connection part is an electrically conductive second platform,
the connection assembly has an electrically conductive crossmember as the crossmember, the first length portion adjoining the first longitudinal end of said crossmember and the second length portion adjoining the second longitudinal end of said crossmember,
the first substrate and the second substrate are mounted in a position fixed relative to one another in such a way that the first length portion overlaps the connection portion of the first platform in a first overlap region and is connected to the connection portion of the first platform within the first overlap region by a welded connection as the cohesive connection,
and the second length portion overlaps the connection portion of the second platform in a second overlap region and is connected to the connection portion of the second platform within the second overlap region by a welded connection as the second cohesive connection.

* * * * *